(12) United States Patent
Kase et al.

(10) Patent No.: US 9,124,370 B2
(45) Date of Patent: Sep. 1, 2015

(54) LIGHT EMITTING ELEMENT DRIVE CIRCUIT AND LIGHT EMITTING DEVICE

(71) Applicant: FUJITSU LIMITED, Kawasaki-shi, Kanagawa (JP)

(72) Inventors: Mariko Kase, Isehara (JP); Yukito Tsunoda, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 56 days.

(21) Appl. No.: 13/963,459

(22) Filed: Aug. 9, 2013

(65) Prior Publication Data

US 2014/0117873 A1    May 1, 2014

(30) Foreign Application Priority Data

Oct. 30, 2012    (JP) ................... 2012-239180

(51) Int. Cl.
| | | |
|---|---|---|
| *H04N 9/28* | (2006.01) | |
| *H04N 3/233* | (2006.01) | |
| *H01J 31/20* | (2006.01) | |
| *H04B 10/50* | (2013.01) | |
| *H01S 5/042* | (2006.01) | |
| *H01S 5/062* | (2006.01) | |
| *H01S 5/183* | (2006.01) | |

(52) U.S. Cl.
CPC ............ *H04B 10/504* (2013.01); *H01S 5/0428* (2013.01); *H01S 5/06226* (2013.01); *H01S 5/183* (2013.01)

(58) Field of Classification Search
None
See application file for complete search history.

(56) References Cited

U.S. PATENT DOCUMENTS

| | | | | |
|---|---|---|---|---|
| 5,274,490 | A | * | 12/1993 | Tsushima et al. ............. 398/204 |
| 5,712,538 | A | * | 1/1998 | Vis et al. ...................... 315/383 |
| 5,739,937 | A | * | 4/1998 | Liedenbaum et al. ........ 398/213 |
| 6,407,519 | B1 | * | 6/2002 | Sakurai ......................... 315/371 |
| 2004/0113656 | A1 | | 6/2004 | Sato |
| 2008/0226295 | A1 | | 9/2008 | Miura et al. |

(Continued)

FOREIGN PATENT DOCUMENTS

| | | |
|---|---|---|
| JP | 2004-88693 | 3/2004 |
| JP | 2007-288505 | 11/2007 |
| JP | 2008-83449 | 4/2008 |

(Continued)

OTHER PUBLICATIONS

Bowers, High Speed Semiconductor Laser Design and Performance, AT&T Bell Labs, 1987.*

(Continued)

*Primary Examiner* — Douglas W Owens
*Assistant Examiner* — Dedei K Hammond
(74) *Attorney, Agent, or Firm* — Staas & Halsey LLP

(57) ABSTRACT

A light emitting element drive circuit includes: a plurality of signal paths that respectively propagate a plurality of signals obtained by branching an input signal, a plurality of filters different in a frequency band to pass a signal; one or more amplifiers configured to amplify a signal, one or more delay circuits configured to delay a signal, and an addition circuit that adds a plurality of signals, the filter different in the frequency band being arranged in each of the plurality of signal paths, the delay circuit being arranged in one or more of the plurality of signal paths relatively low in the frequency band, the amplifier being arranged in one or more of the plurality of signal paths relatively high in the frequency band, and an output end of each of the plurality of signal paths being coupled to the addition circuit.

9 Claims, 10 Drawing Sheets

(56) References Cited

U.S. PATENT DOCUMENTS

2010/0027934 A1    2/2010   Shimizu et al.
2012/0045223 A1    2/2012   Oku et al.

FOREIGN PATENT DOCUMENTS

JP     2008-129476    6/2008
JP     2012-44396    3/2012

OTHER PUBLICATIONS

Bowers, High Speed Semiconductor Laser Design & Performance, AT&T Bell Labs, 1987.*

J. E. Bowers, "High Speed Semiconductor Laser Design and Performance," *Solid-State Electronics*, Pergamon Journals Ltd., vol. 30, No. 1, 1987, pp. 1-11.

\* cited by examiner

LIGHT EMITTING ELEMENT DRIVE CIRCUIT AND LIGHT EMITTING DEVICE

CROSS-REFERENCE TO RELATED APPLICATION

This application is based upon and claims the benefit of priority of the prior Japanese Patent Application No. 2012-239180, filed on Oct. 30, 2012, the entire contents of which are incorporated herein by reference.

FIELD

The embodiment discussed herein is related to a light emitting element drive circuit and a light emitting device.

BACKGROUND

One of typical techniques applied to a data transmission system is a pre-emphasis technique. According to the pre-emphasis technique, when a frequency component of a signal attenuated during transmission is intensified in advance on the transmission side, the amplitude of the received signal may be increased on the reception side and an eye pattern may be secured. For example, Japanese Laid-open Patent Publication No. 2004-88693 discusses a circuit that generates a signal having a pre-emphasis waveform by branching a data signal into two signals, delaying one of the branched signals, and obtaining a difference between the delayed signal and the other signal.

However, the circuit according to the pre-emphasis technique may fail to reduce time-directional fluctuations caused in an output waveform of a light emitting element.

SUMMARY

According to an aspect of the embodiment, a light emitting element drive circuit includes: a plurality of signal paths that respectively propagate a plurality of signals obtained by branching an input signal, a plurality of filters different in a frequency band to pass a signal, one or more amplifiers configured to amplify a signal, one or more delay circuits configured to delay a signal, and an addition circuit that adds a plurality of signals, the filter different in the frequency band being arranged in each of the plurality of signal paths, the delay circuit being arranged in one or more of the plurality of signal paths relatively low in the frequency band, the amplifier being arranged in one or more of the plurality of signal paths relatively high in the frequency band, and an output end of each of the plurality of signal paths being coupled to the addition circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

A preferred embodiment of a light emitting element drive circuit and a light emitting device is described in detail below with reference to the accompanying drawings. In the description of each example below, the same references are given to similar elements and repeated explanation is omitted.

Examples of a light emitting element include a vertical cavity surface emitting laser (VCSEL), an edge emitting laser, and a light emitting diode (LED). The present embodiment is described, taking the VCSEL as an example. Since the VCSEL is inexpensive and may be driven by direct modulation, a light emitting element drive circuit and a light emitting device may be obtained at low costs. Therefore, the light emitting element drive circuit and the light emitting device using the VCSEL are advantageous to short distance communication in a computer device like a server, such as an optical interconnection technique.

Example of Output Characteristics of VCSEL

Figure 1:
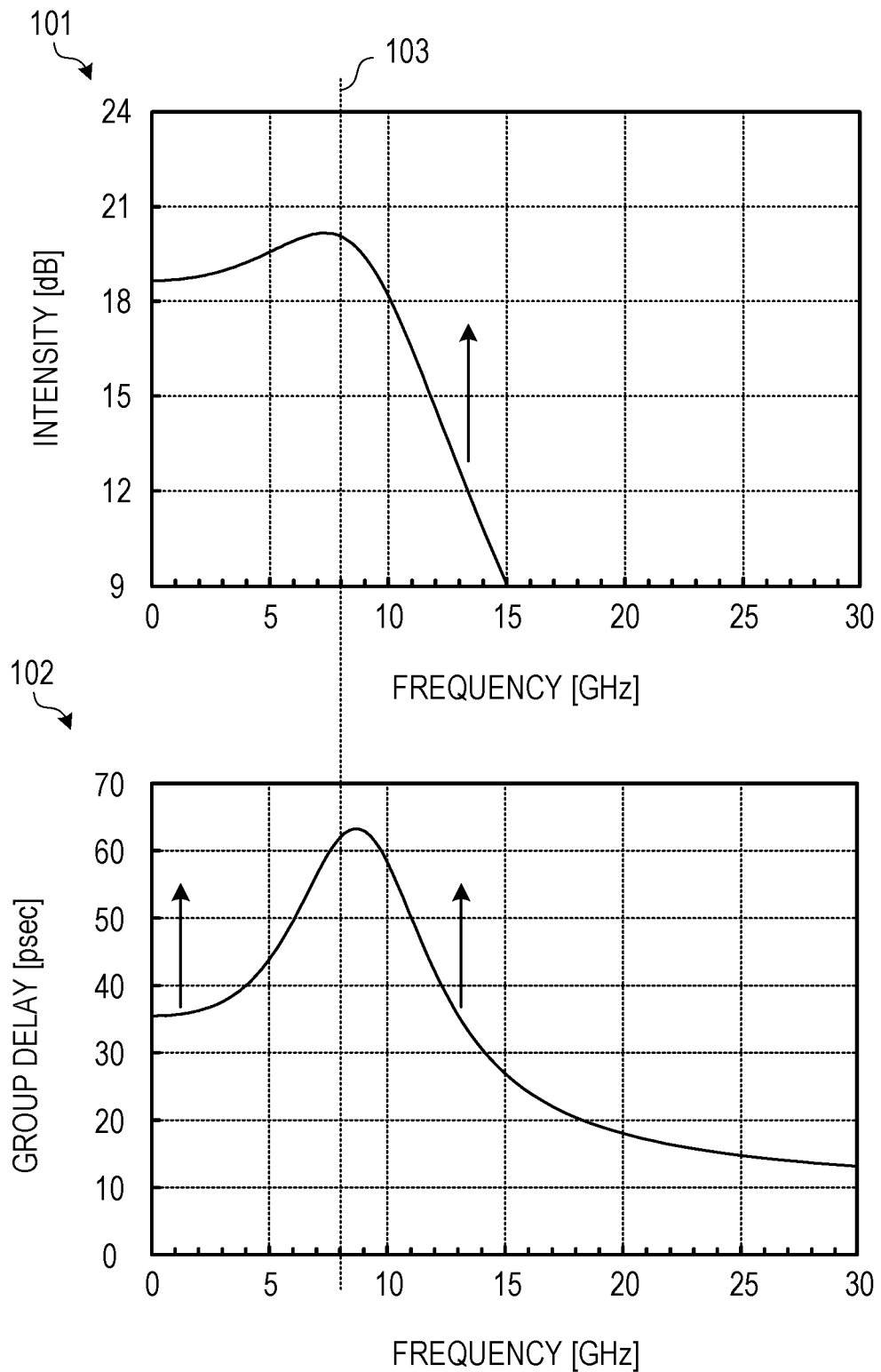
FIG. 1 illustrates an example of output characteristics of a vertical cavity surface emitting laser (VCSEL)

FIG. 1 illustrates an example of output characteristics of the VCSEL. A frequency-intensity characteristic graph 101 on the upper side of FIG. 1 indicates frequency characteristics of intensity. The vertical axis indicates the intensity [dB] and the horizontal axis indicates the frequency [GHz]. As illustrated in the frequency-intensity characteristic graph 101, the intensity slightly increases as the frequency becomes higher in a low frequency region, which is equal to or lower than approximately 8 GHz, peaks at a frequency of approximately 8 GHz, and rapidly decreases as the frequency becomes higher in a high frequency region, which is equal to or higher than approximately 8 GHz. Thus, as indicated by an arrow in the frequency-intensity characteristic graph 101, it is desirable in the light emitting element drive circuit that drives the VCSEL to perform correction by the pre-emphasis technique so as to increase the intensity in the high frequency region.

A frequency-group delay characteristic graph 102 on the lower side of FIG. 1 indicates frequency characteristics of a group delay. The vertical axis indicates the group delay [psec] and the horizontal axis indicates the frequency [GHz]. As illustrated in the frequency-group delay characteristic graph 102, for example, the group delay increases as the frequency becomes higher in a low frequency region, which is equal to or lower than approximately 8 GHz, peaks at a frequency of approximately 8 GHz, and decreases as the frequency becomes higher in a high frequency region, which is equal to or higher than approximately 8 GHz. Thus, as indicated by arrows in the frequency-group delay characteristic graph 102, it is desirable in the light emitting element drive circuit that drives the VCSEL to perform correction by the pre-emphasis technique so as to increase both the group delay in the low frequency region and the group delay in the high frequency region.

In the frequency-intensity characteristic graph 101 and the frequency-group delay characteristic graph 102, the peak positions indicated by a dotted line 103 are determined by, for example, a rate equation so as to be unique. The rate equation is discussed in, for example, "High speed semiconductor laser design and performance" (Solid-State Electronics Vol. 30, No. 1, pp. 1-11, 1987) by J. E. Bowers.

The rate equation may be expressed by equations (1) and (2) below, where N represents a carrier density, S represents a photon density, $g_0$ represents a differential gain coefficient, $N_t$ represents a transparent carrier density, $\tau_n$ represents a spontaneous emission carrier lifetime, and $\tau_p$ represents a photon lifetime. Further, $\Gamma$ represents a light containment coefficient, $\epsilon$ represents a nonlinear coefficient, $\beta$ represents a spontaneous emission coefficient, I represents a current that flows through an active layer, q represents an elementary charge, and V represents the volume of the active layer.

$$\frac{dN}{dt} = -\frac{g_0(N-N_t)S}{1+\epsilon S} + \frac{1}{qV} - \frac{N}{\tau_n} \quad (1)$$

$$\frac{dS}{dt} = \frac{\Gamma g_0(N-N_t)S}{1+\epsilon S} - \frac{S}{\tau_p} + \frac{\beta \Gamma N}{\tau_n} \quad (2)$$

First Example of Light Emitting Element Drive Circuit and Light Emitting Device

Figure 2:
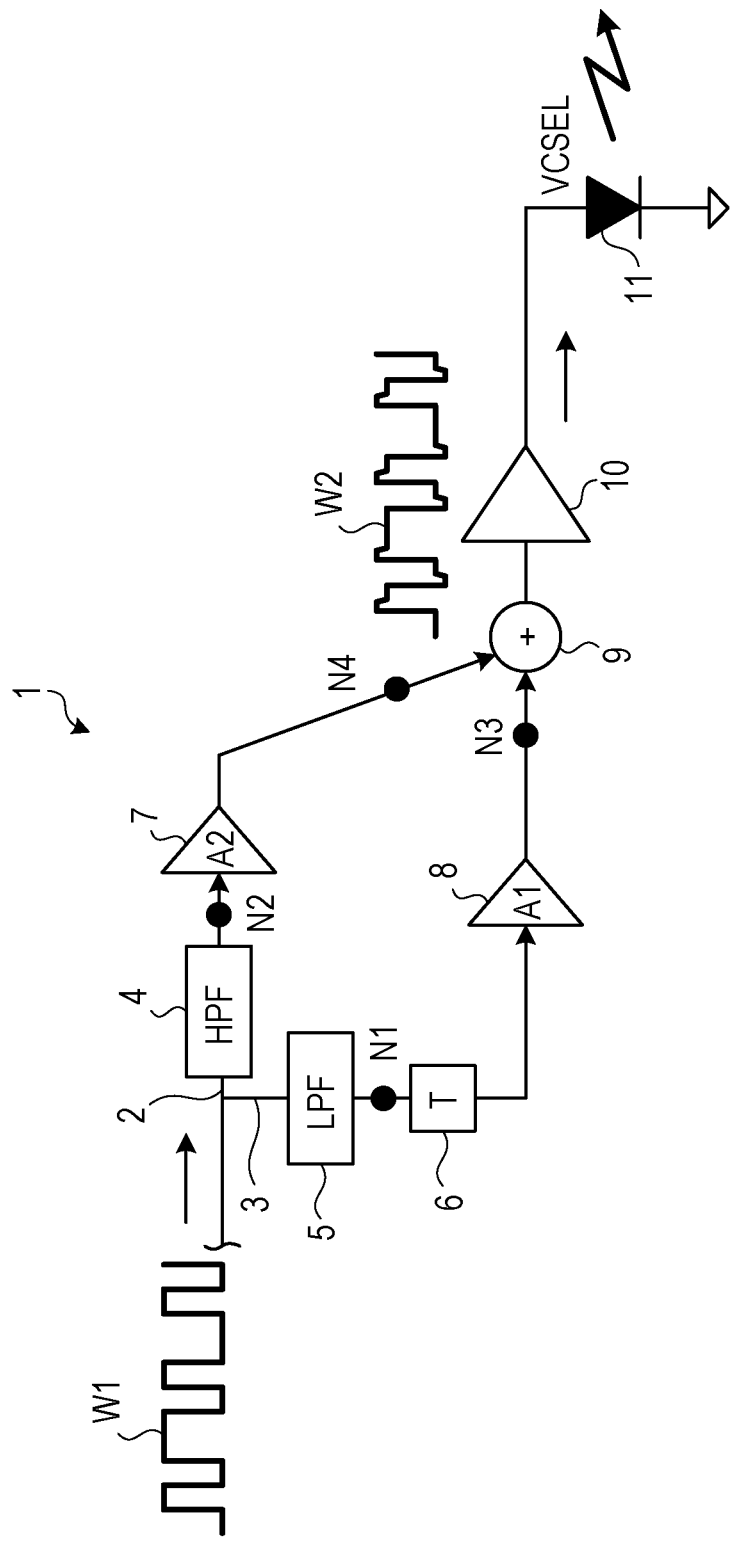
FIG. 2 illustrates a first example of a light emitting element drive circuit and a light emitting device according to an embodiment.

FIG. 2 illustrates a first example of the light emitting element drive circuit and the light emitting device according to the embodiment. As illustrated in FIG. 2, the light emitting device includes a light emitting element 11 and a light emitting element drive circuit 1 that drives the light emitting element 11. The VCSEL is an example of the light emitting element 11.

The light emitting element drive circuit 1 includes a plurality of signal paths 2 and 3 that respectively propagate a plurality of signals obtained by branching an input signal having a waveform W1 for example. Although in the example illustrated in FIG. 2, the number of signal paths is two, the number of signal paths may be three or more. The present embodiment is described, assuming that the number of signal paths is two. One of the two signal paths on the high-frequency side is referred to as the signal path 2, and the other signal path on the low-frequency side is referred to as the signal path 3.

A high-pass filter 4 and a low-pass filter 5 with different frequency bands for allowing signals to pass are arranged in the signal paths 2 and 3, respectively. For example, the high-pass filter 4 and an amplifier 7 may be arranged in the signal path 2 on the high-frequency side. The high-pass filter 4 is coupled to, for example, a branch point at which the input signal is branched. A cutoff frequency of the high-pass filter 4 may be the frequency at the peak position determined by the rate equation. That is, a signal of a component with a frequency higher than the frequency at the peak position determined by the rate equation may propagate through the signal path 2 on the high-frequency side.

The high-pass filter 4 has characteristics that delay a signal that passes through the high-pass filter 4. That is, the high-pass filter 4 increases the group delay of a signal of a high-frequency component, which passes through the high-pass filter 4. Thus, the high-pass filter 4 increases the group delay of the signal of the high-frequency component, which propagates through the signal path 2 on the high-frequency side.

The amplifier 7 is coupled to the high-pass filter 4. The amplifier 7 amplifies the intensity of the signal of the high-frequency component, which passes through the high-pass filter 4. A gain A2 of the amplifier 7 may be determined through simulations or experiments.

For example, the low-pass filter 5 and a delay circuit 6 may be arranged in the signal path 3 on the low-frequency side. The low-pass filter 5 is coupled to, for example, a branch point at which the input signal is branched. A cutoff frequency of the low-pass filter 5 may be the frequency at the peak position determined by the rate equation. That is, a signal of a component with a frequency lower than the frequency at the peak position determined by the rate equation may propagate through the signal path 3 on the low-frequency side. The cutoff frequencies of the high-pass filter 4 and the low-pass filter 5 may be readily determined using the rate equation.

The delay circuit 6 is coupled to the low-pass filter 5. The delay circuit 6 increases the group delay of the signal of the low-frequency component, which passes through the low-pass filter 5, by time T. The time T may be determined through simulations or experiments.

Further, an amplifier 8 may be arranged in the signal path 3 on the low-frequency side. When the amplifier 8 is arranged in the signal path 3 on the low-frequency side, the amplifier 8 may be coupled to the delay circuit 6. The amplifier 8 amplifies the intensity of the signal of the low-frequency component output from the delay circuit 6. A gain A1 of the amplifier 8 may be determined through simulations or experiments. The amplifier 8 may be arranged between the low-pass filter 5 and the delay circuit 6. Also, the amplifier 8 may be arranged before and subsequent to the delay circuit 6.

Each output end of the signal path 2 on the high-frequency side and the signal path 3 on the low-frequency side is coupled to an addition circuit 9. The addition circuit 9 adds the signal of the high-frequency component, which propagates through the signal path 2 on the high-frequency side and is amplified by the amplifier 7, and the signal of the low-frequency component, which propagates through the signal path 3 on the low-frequency side and is delayed by the delay circuit 6. When the amplifier 8 is arranged in the signal path 3 on the low-frequency side, the signal of the low-frequency component, which is added by the addition circuit 9, is amplified by the amplifier 8.

The light emitting element 11 is driven based on a signal having a waveform W2, which is output from the addition circuit 9. As in the example illustrated in FIG. 2, an amplifier 10 may be coupled to the addition circuit 9. The amplifier 10 amplifies a signal output from the addition circuit 9. The light emitting element 11 may be driven by the signal having the waveform W2, which is output from the amplifier 10. In the example illustrated in FIG. 2, the light emitting element 11 is an anode driving type, where the anode is coupled to an output terminal of the amplifier 10 and the cathode is grounded for example.

In FIG. 2, filled circles represent nodes. N1 represents a node between the low-pass filter 5 and the delay circuit 6, N2 represents a node between the high-pass filter 4 and the amplifier 7, N3 represents a node between the amplifier 8 and the addition circuit 9, and N4 represents a node between the amplifier 7 and the addition circuit 9.

Figure 3:
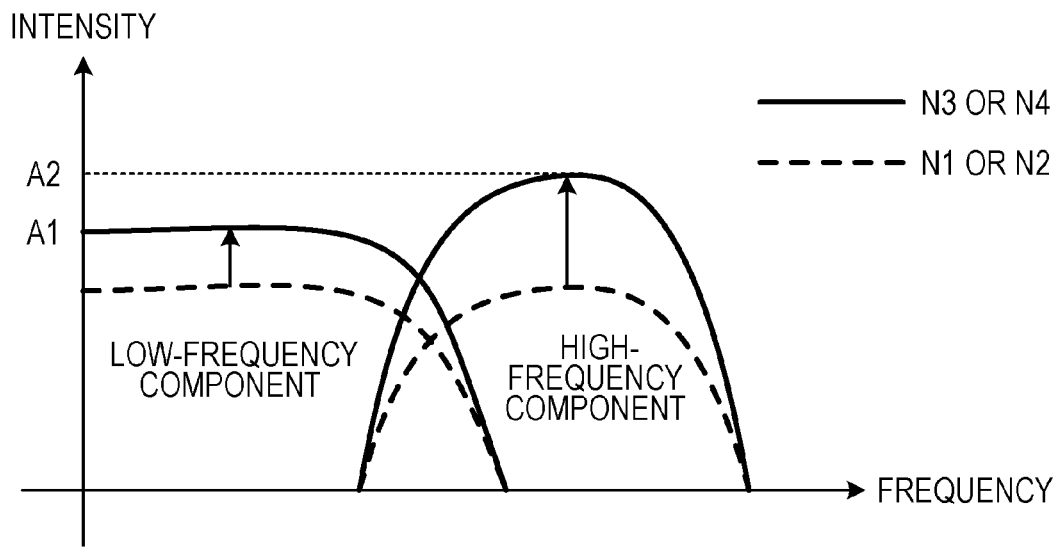
FIG. 3 qualitatively illustrates how intensity is corrected by the light emitting element drive circuit illustrated in FIG. 2.

FIG. 3 qualitatively illustrates how intensity is corrected by the light emitting element drive circuit illustrated in FIG. 2. The vertical axis indicates the intensity and the horizontal axis indicates the frequency. As illustrated in FIG. 3, for example, when the signal of the low-frequency component is amplified by the amplifier 8, the intensity at the node N3, which is represented by a solid line, is higher than the intensity at the node N1, which is represented by a broken line. When the signal of the high-frequency component is amplified by the amplifier 7, the intensity at the node N4, which is represented by a solid line, is higher than the intensity at the node N2, which is represented by a broken line.

As indicated by the arrow in the frequency-intensity characteristic graph 101 in FIG. 1, the correction is desirably performed so that the intensity may become higher in the high frequency region. Thus, the gain A2 of the amplifier 7 on the high-frequency side may be larger than the gain A1 of the amplifier 8 on the low-frequency side.

Figure 4:
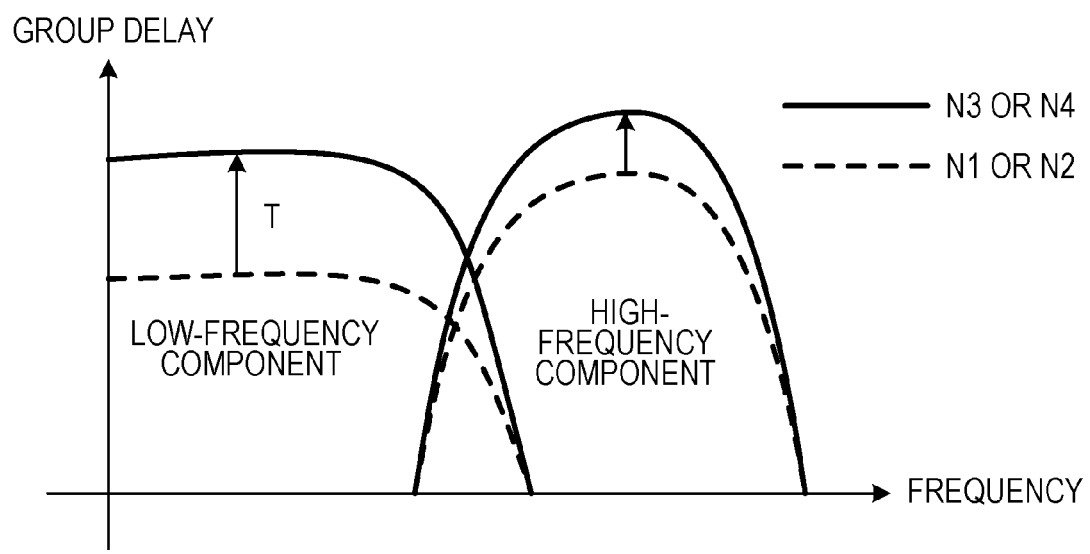
FIG. 4 qualitatively illustrates how a group delay is corrected by the light emitting element drive circuit illustrated in FIG. 2.

FIG. 4 qualitatively illustrates how the group delay is corrected by the light emitting element drive circuit illustrated in FIG. 2. The vertical axis indicates the group delay and the horizontal axis indicates the frequency. As illustrated in FIG. 4, when the signal of the low-frequency component passes through the delay circuit 6, the group delay at the node N3, which is represented by a solid line, is larger than the group delay at the node N1, which is represented by a broken line, by time T.

The group delay of the signal of the high-frequency component increases when the signal of the high-frequency component passes through the high-pass filter 4. Thus, the group delay at the node N2 on the high-frequency side, which is represented by a broken line, is higher than the group delay at the node N1 on the low-frequency side, which is represented by a broken line. When the signal of the high-frequency component passes through the amplifier 7, the group delay at the node N4, which is represented by a solid line, is larger than the group delay at the node N2, which is represented by the broken line.

Example of Simulation Results

Figure 5:
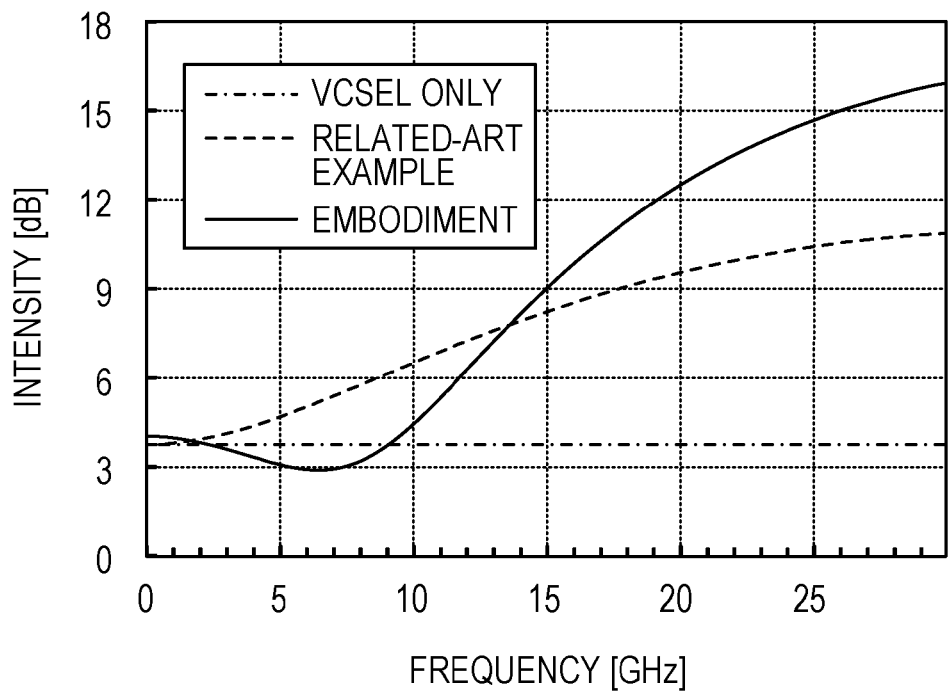
FIG. 5 illustrates an example of frequency characteristics of the intensity of a signal input to a light emitting element.
Figure 6:
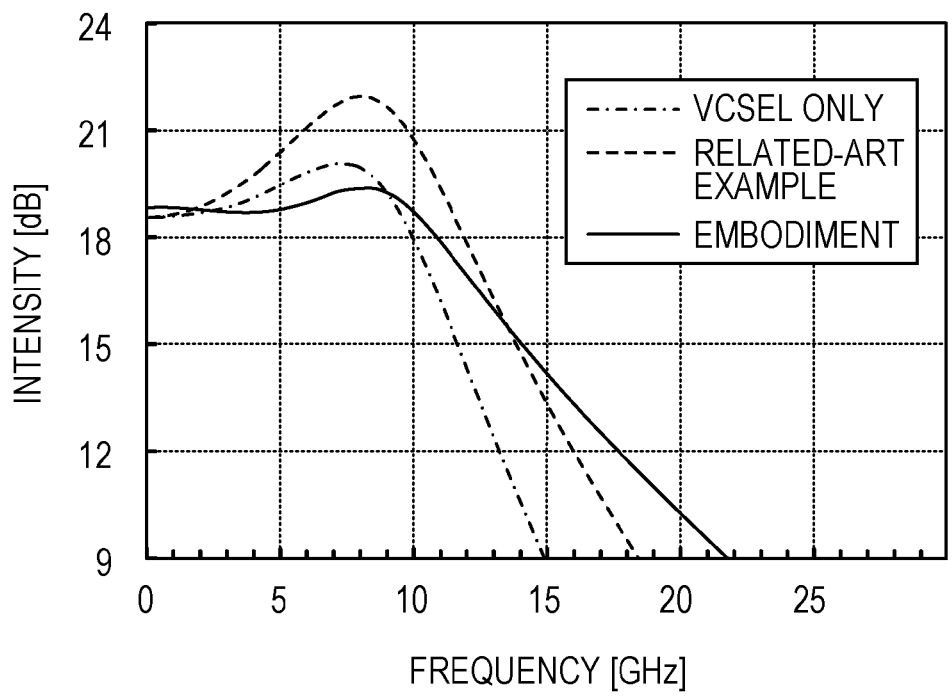
FIG. 6 illustrates an example of frequency characteristics of the intensity of a signal output from the light emitting element.

FIG. 5 illustrates an example of frequency characteristics of the intensity of a signal input to the light emitting element. FIG. 6 illustrates an example of frequency characteristics of the intensity of a signal output from the light emitting element. In each of FIGS. 5 and 6, the vertical axis indicates the intensity [dB] and the horizontal axis indicates the frequency [GHz].

Figure 7:
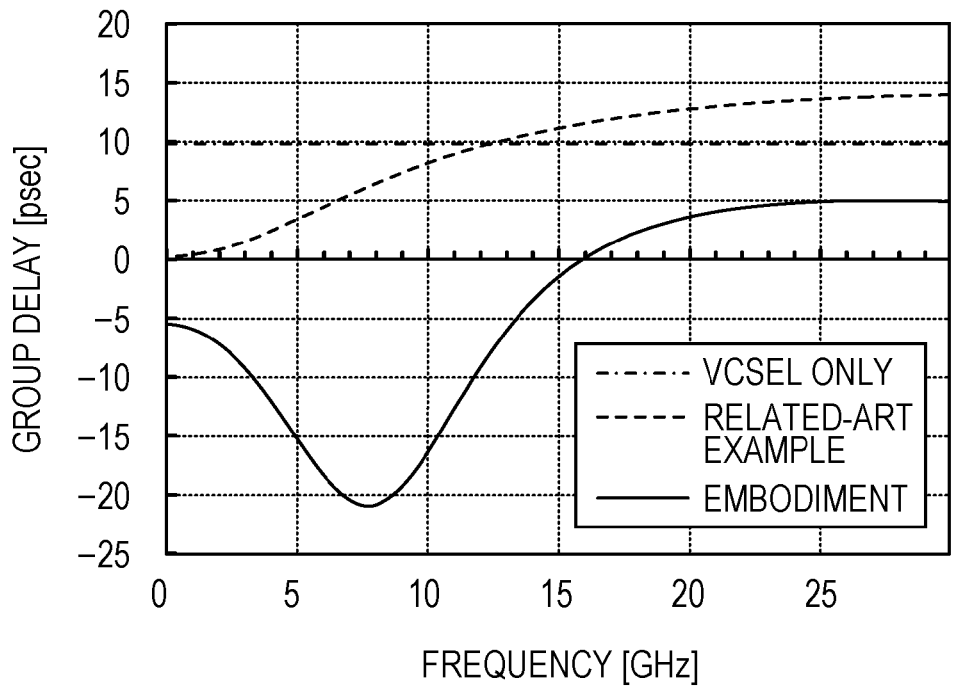
FIG. 7 illustrates an example of frequency characteristics of the group delay of the signal input to the light emitting element.
Figure 8:
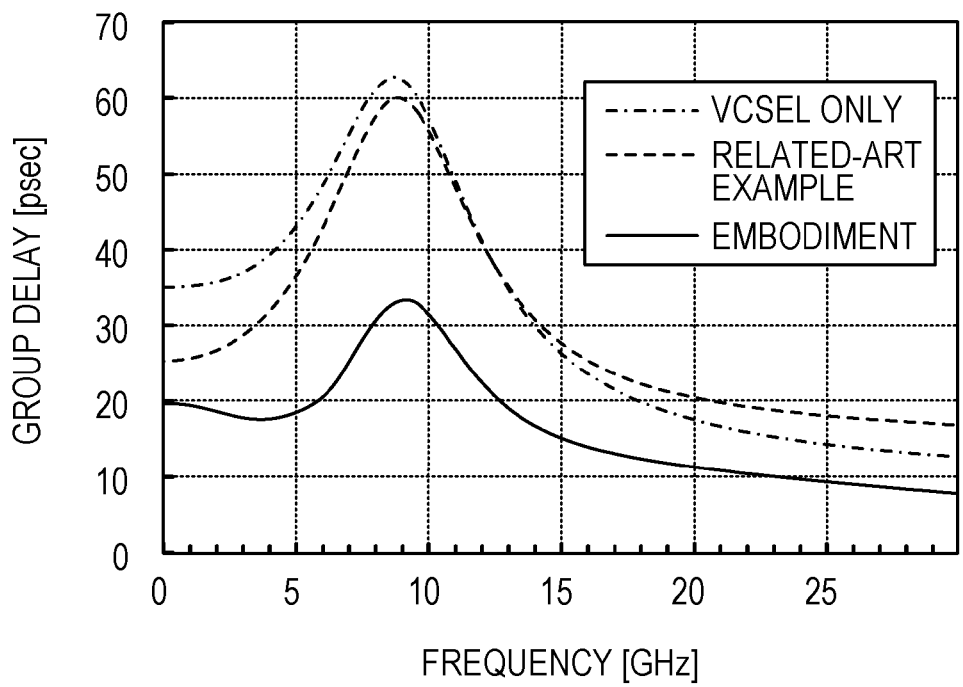
FIG. 8 illustrates an example of frequency characteristics of the group delay of the signal output from the light emitting element.

FIG. 7 illustrates an example of frequency characteristics of the group delay of the signal input to the light emitting element. FIG. 8 illustrates an example of frequency characteristics of the group delay of the signal output from the light emitting element. In each of FIGS. 7 and 8, the vertical axis indicates the group delay [psec] and the horizontal axis indicates the frequency [GHz].

In each of FIGS. 5 to 8, a characteristic curve of "EMBODIMENT", which is represented by a solid line, indicates simulation results for the light emitting device illustrated in FIG. 2. A characteristic curve of "RELATED-ART EXAMPLE", which is represented by a broken line, indicates simulation results for the device discussed in Japanese Laid-open Patent Publication No. 2004-88693, that is, a device using a circuit that generates a signal having a pre-emphasis waveform by branching a signal into two signals, delaying one of the branched signals, and obtaining a difference between the delayed signal and the other signal. A characteristic curve of "VCSEL ONLY", which is represented by an alternate long and short dash line, indicates simulation results for a case only with the VCSEL, to which the pre-emphasis technique is not applied.

With regard to "VCSEL ONLY", when for example, a signal that has flat frequency characteristics with an intensity of 4 dB is input to the VCSEL as illustrated in FIG. 5, the intensity of the output signal of the VCSEL rapidly decreases as the frequency becomes higher than, for example, approximately 8 GHz as illustrated in FIG. 6. With regard to "RELATED-ART EXAMPLE", when a signal that has frequency characteristics, where the intensity increases from the low-frequency side as the frequency becomes higher as illustrated in FIG. 5, is input to the VCSEL, the intensity of the output signal of the VCSEL is enhanced on the side of the frequency higher than, for example, approximately 8 GHz as illustrated in FIG. 6.

With regard to "EMBODIMENT", when a signal that has frequency characteristics, where the intensity increases as the frequency becomes higher on the side of the frequency higher than approximately 8 GHz as illustrated in FIG. 5, is input to the VCSEL, the intensity of the output signal of the VCSEL is enhanced on the side of the frequency higher than, for example, approximately 8 GHz as illustrated in FIG. 6.

With regard to "VCSEL ONLY", for example, a signal that has flat frequency characteristics with a group delay of 10 psec is input to the VCSEL as illustrated in FIG. 7. Then, as illustrated in FIG. 8, a group delay larger than the group delays at frequencies of, for example, 1 GHz and 14 GHz by 30 to 35 psec is caused in the output signal of the VCSEL at a frequency of approximately 8 GHz. With regard to "RELATED-ART EXAMPLE", a signal that has frequency characteristics, where the group delay increases as the frequency becomes higher from the low-frequency side as illustrated in FIG. 7, is input to the VCSEL. Then, as illustrated in FIG. 8, a group delay larger than the group delays at frequencies of, for example, 1 GHz and 14 GHz by 30 to 35 psec is caused in the output signal of the VCSEL at a frequency of approximately 8 GHz.

With regard to "EMBODIMENT", a signal that has frequency characteristics, where the group delay decreases as the frequency becomes higher on the side of the frequency lower than approximately 8 GHz and where the group delay increases as the frequency becomes higher on the side of the frequency higher than approximately 8 GHz as illustrated in FIG. 7, is input to the VCSEL. Then, as illustrated in FIG. 8, a group delay larger than the group delays at frequencies of, for example, 4 GHz and 14 GHz by 16 to 17 psec is caused in the output signal of the VCSEL at a frequency of approximately 8 GHz, and phase characteristics may be flattened in comparison with the related-art example.

Figure 9:
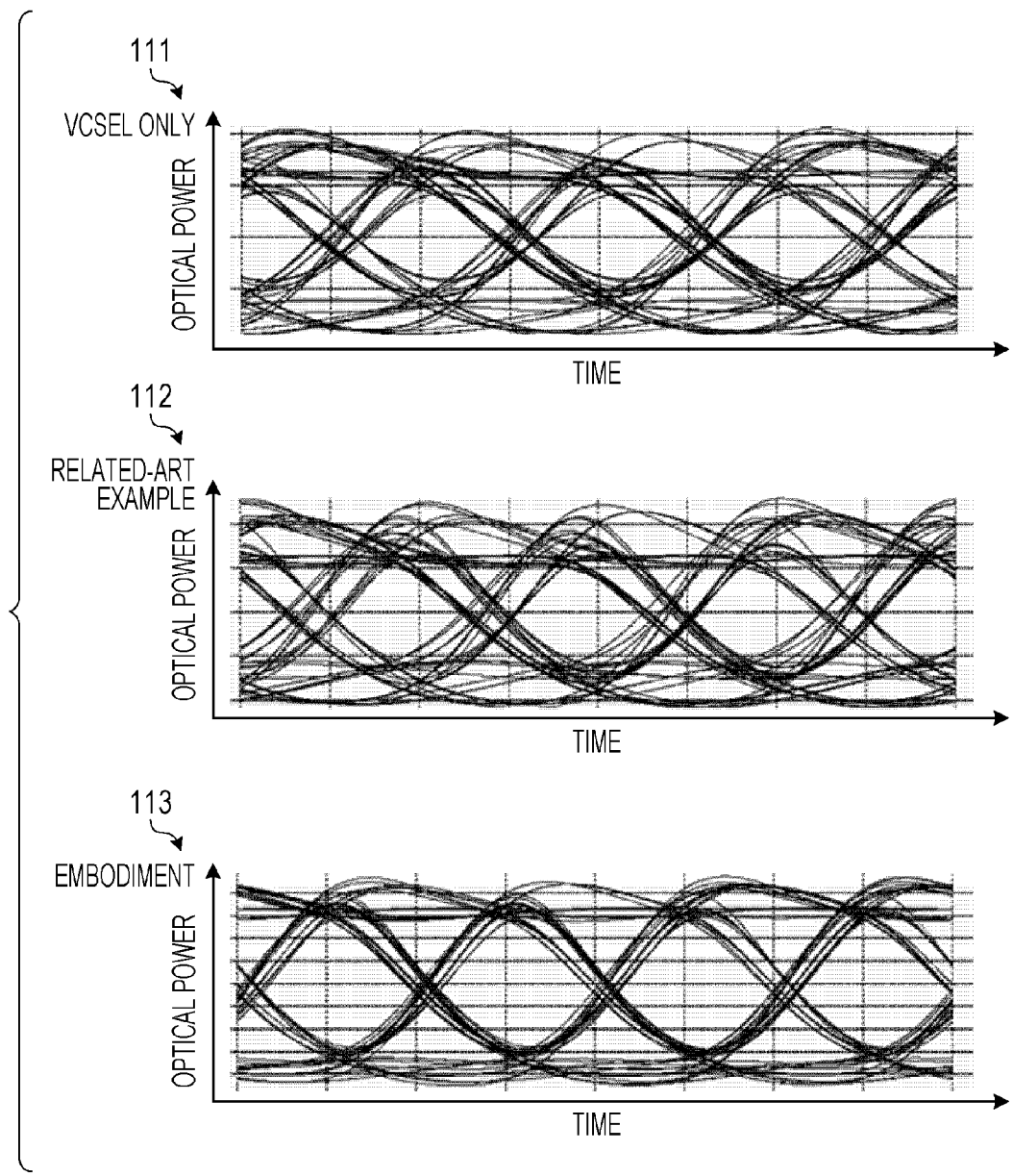
FIG. 9 illustrates an example of an eye pattern of the signal output from the light emitting element.

FIG. 9 illustrates an example of an eye pattern of the signal output from the light emitting element. An eye pattern 111 of "VCSEL ONLY", which is illustrated on the upper side of FIG. 9, indicates simulation results for a case only with the VCSEL, to which the pre-emphasis technique is not applied. An eye pattern 112 of "RELATED-ART EXAMPLE", which is illustrated in the middle of FIG. 9, indicates simulation results for the device discussed in Japanese Laid-open Patent Publication No. 2004-88693, that is, a device using a circuit that generates a signal having a pre-emphasis waveform by branching a signal into two signals, delaying one of the branched signals, and obtaining a difference between the delayed signal and the other signal. An eye pattern 113 of "EMBODIMENT", which is illustrated on the lower side of FIG. 9, indicates simulation results for the light emitting device illustrated in FIG. 2. In each of the eye patterns 111 to 113 in FIG. 9, the vertical axis indicates optical power and the horizontal axis indicates time.

When the eye pattern 112 of "RELATED-ART EXAMPLE" is compared with the eye pattern 111 of "VCSEL ONLY", it is found that when the intensity in the high frequency region is enhanced in "RELATED-ART EXAMPLE", the opening degree of the eye waveform in "RELATED-ART EXAMPLE" is reduced. However, in "RELATED-ART EXAMPLE", fluctuations in the time direction remain unreduced. In contrast, when the eye pattern 113 of "EMBODIMENT" is compared with the eye pattern 112 of "RELATED-ART EXAMPLE", it is found that when the intensity in the high frequency region is enhanced in "EMBODIMENT", the opening degree of the eye waveform in "EMBODIMENT" is further reduced. Also, it is found that when the group delay in the low frequency region is improved in "EMBODIMENT", fluctuations in the time direction are reduced in "EMBODIMENT".

According to the light emitting element drive circuit and the light emitting device illustrated in FIG. 2, the intensity in the high frequency region of the output waveform of the light emitting element may be enhanced and in addition, fluctuations in the time direction of the output waveform of the light emitting element may be suppressed.

Figure 10:
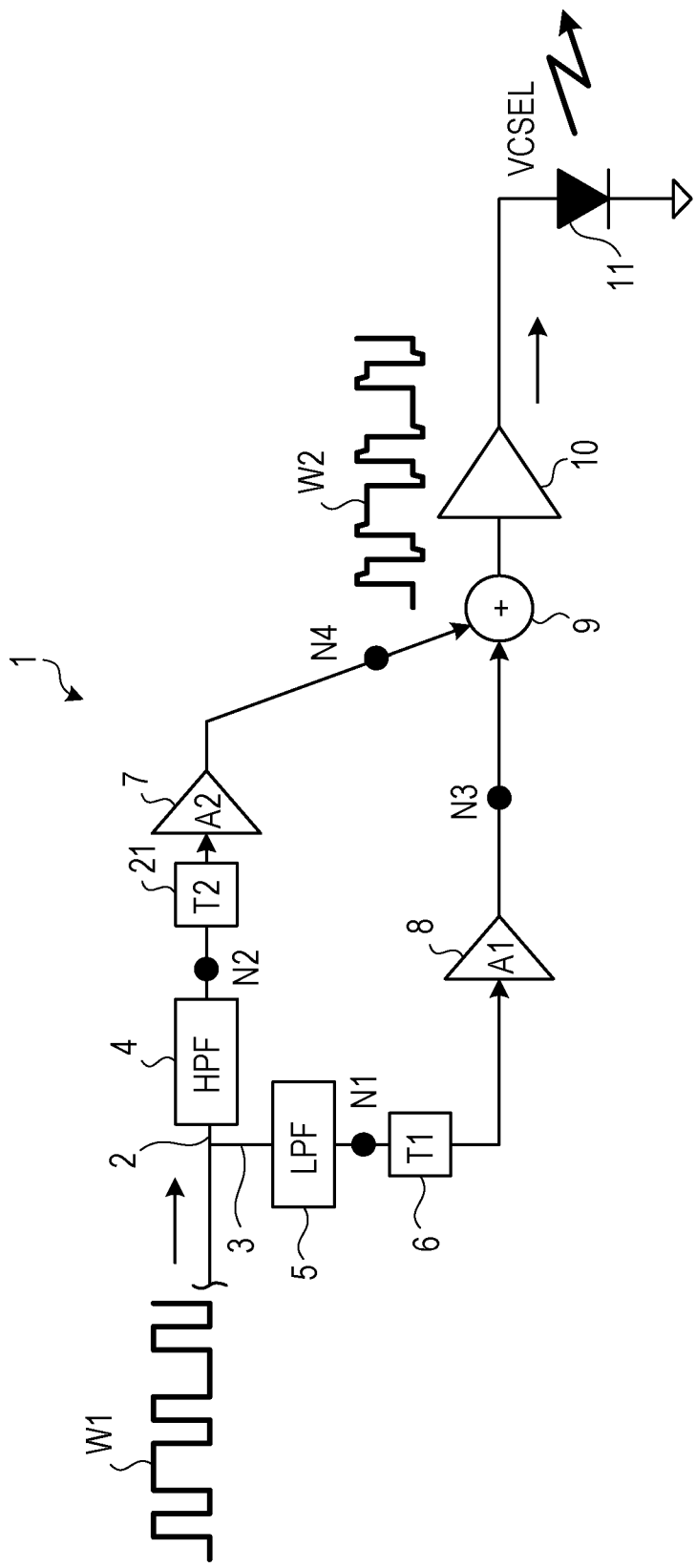
FIG. 10 illustrates a second example of the light emitting element drive circuit and the light emitting device according to the embodiment.

Second Example of Light Emitting Element Drive Circuit and Light Emitting Device FIG. 10 illustrates a second example of the light emitting element drive circuit and the light emitting device according to the embodiment. In the light emitting element drive circuit and the light emitting device illustrated in FIG. 10, compared with the light emitting element drive circuit and the light emitting device illustrated in FIG. 2, a delay circuit 21 is arranged also in the signal path 2 on the high-frequency side.

The delay circuit 21 is coupled to the high-pass filter 4. The delay circuit 21 increases the group delay of a signal of a high-frequency component, which passes through the high-pass filter 4, by time T2. In the light emitting element drive circuit 1 illustrated in FIG. 10, the delay circuit 6 arranged in the signal path 3 on the low-frequency side increases the group delay of a signal of a low-frequency component, which passes through the low-pass filter 5, by time T1. The time T1 and the time T2 may be determined through simulations or experiments.

The amplifier 7 may be arranged between the high-pass filter 4 and the delay circuit 21. Also, the amplifier 7 may be arranged before and subsequent to the delay circuit 21. Since the other constituents are similar to the constituents of the example illustrated in FIG. 2, repeated explanation is omitted. In the example illustrated in FIG. 10, the node N2 is a node between the high-pass filter 4 and the delay circuit 21. The nodes N1, N3, and N4 are the same as the nodes N1, N3, and N4 in the example illustrated in FIG. 2.

Figure 11:
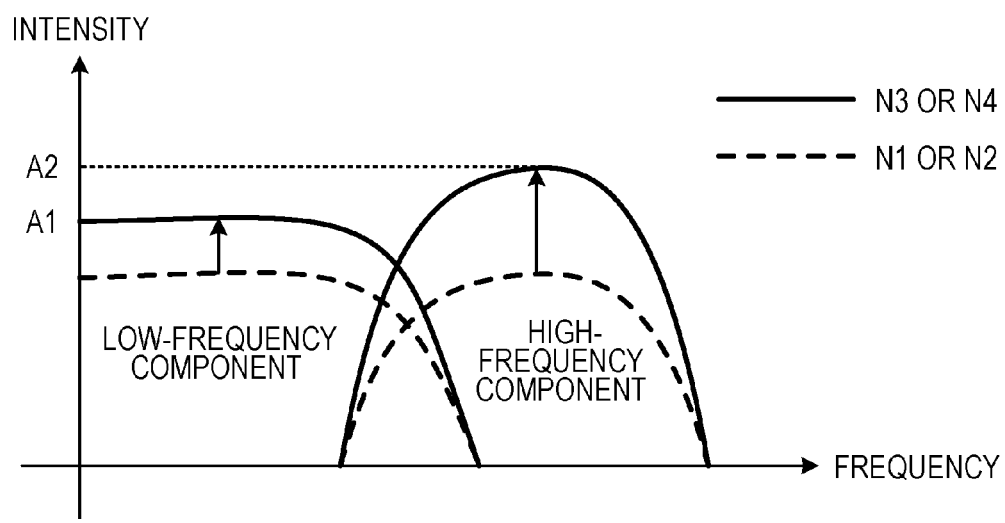
FIG. 11 qualitatively illustrates how intensity is corrected by the light emitting element drive circuit illustrated in FIG. 10.

FIG. 11 qualitatively illustrates how the intensity is corrected by the light emitting element drive circuit illustrated in FIG. 10. The vertical axis indicates the intensity and the horizontal axis indicates the frequency. As illustrated in FIG. 11, when the signal of the low-frequency component is amplified by, for example, the amplifier 8, the intensity at the node N3 represented by a solid line, is higher than the intensity at the node N1, which is represented by a broken line. When the signal of the high-frequency component is amplified by the amplifier 7, the intensity at the node N4, which is represented by a solid line, is higher than the intensity at the node N2, which is represented by a broken line. The gain A2 of the amplifier 7 on the high-frequency side may be larger than the gain A1 of the amplifier 8 on the low-frequency side.

Figure 12:
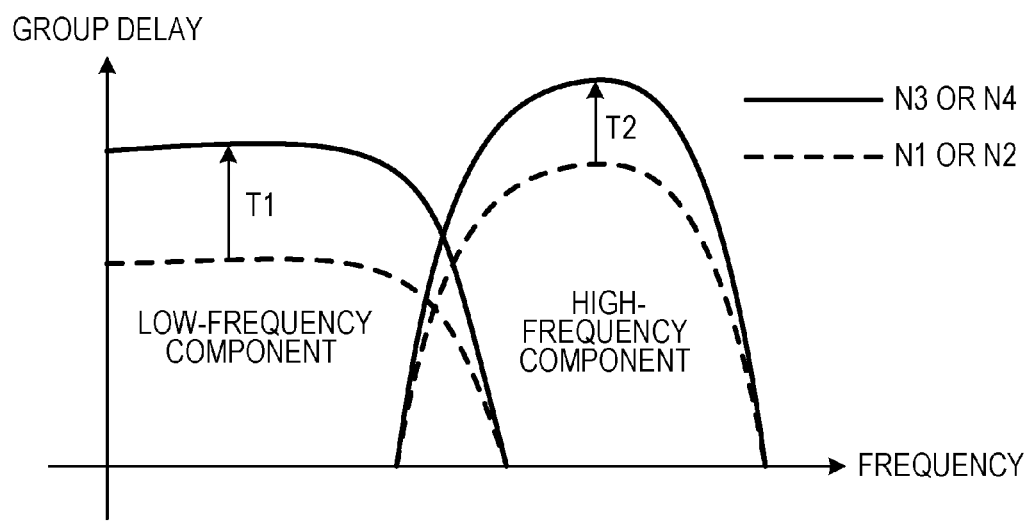
FIG. 12 qualitatively illustrates how a group delay is corrected by the light emitting element drive circuit illustrated in FIG. 10.

FIG. 12 qualitatively illustrates how the group delay is corrected by the light emitting element drive circuit illustrated in FIG. 10. The vertical axis indicates the group delay and the horizontal axis indicates the frequency. As illustrated in FIG. 12, when the signal of the low-frequency component passes through the delay circuit 6, the group delay at the node N3, which is represented by a solid line, is larger than the group delay at the node N1, which is represented by a broken line, by the time T1.

When the signal of the high-frequency component passes through the high-pass filter 4, the group delay increases. Thus, the group delay at the node N2 on the high-frequency side, which is represented by a broken line, is larger than the group delay at the node N1 on the low-frequency side, which is represented by the broken line. When the signal of the high-frequency component passes through the delay circuit 21, the group delay at the node N4, which is represented by a solid line, is larger than the group delay at the node N2, which is represented by the broken line, by the time T2.

According to the light emitting element drive circuit and the light emitting device illustrated in FIG. 10, the intensity in the high frequency region may be enhanced and fluctuations in the time direction of the output waveform of the light emitting element may be reduced. The frequency characteristics of the group delay of the VCSEL may change depending on VCSEL driving conditions, that is, bias conditions. Thus, under some bias conditions, the group delay may be compensated by arranging a delay circuit also on the high-frequency side. According to the light emitting element drive circuit and the light emitting device illustrated in FIG. 10, the group delay may be compensated by arranging the delay circuit 21 in the signal path 2 on the high-frequency side.

When the light emitting element drive circuit 1 branches an input signal into three or more signals, a high-pass filter and an amplifier are preferably arranged in a signal path through which a branched signal of the component highest in frequency propagates, and a low-pass filter and a delay circuit are preferably arranged in a signal path through which another branched signal of the component lowest in frequency propagates. Further, in one or more signal paths through which still another branched signal of an intermediate frequency component propagates, a band-pass filter that limits a frequency band to pass a signal is preferably arranged together with an amplifier or a delay circuit.

Figure 13:
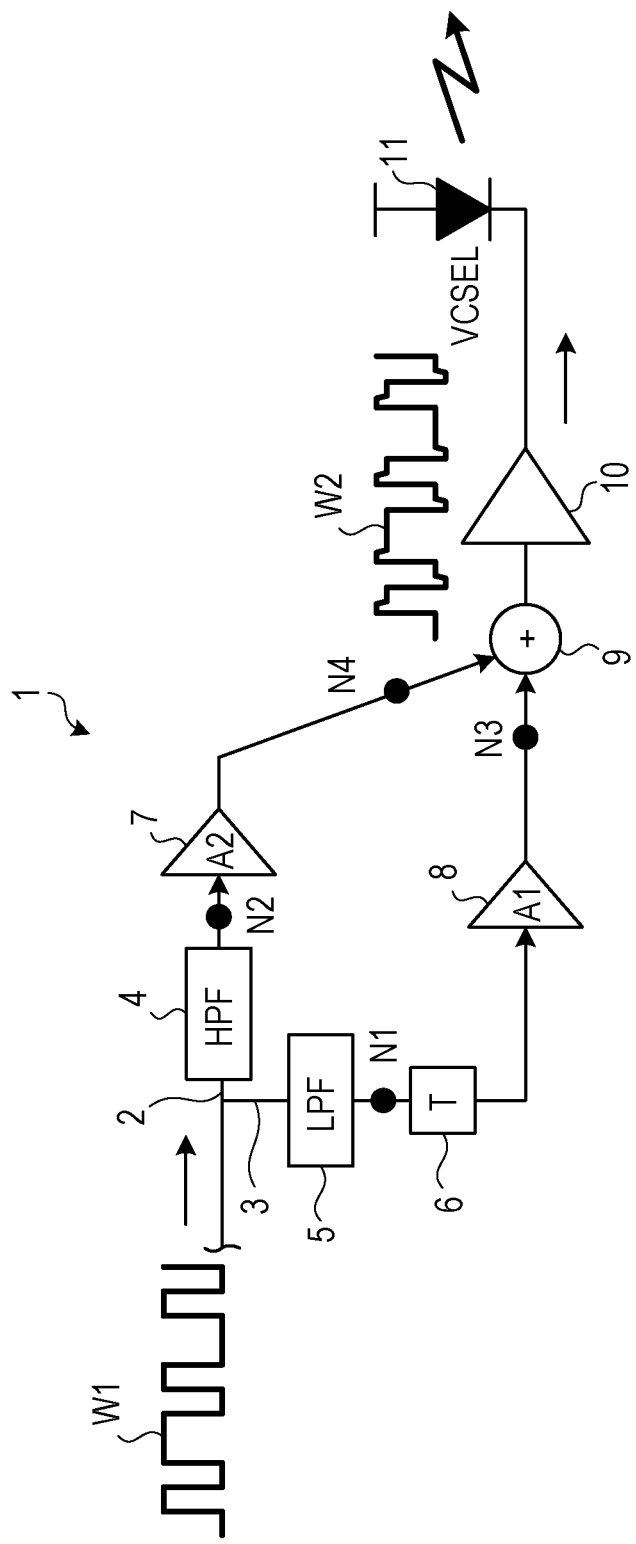
FIG. 13 illustrates a third example of the light emitting element drive circuit and the light emitting device according to the embodiment.
Figure 14:
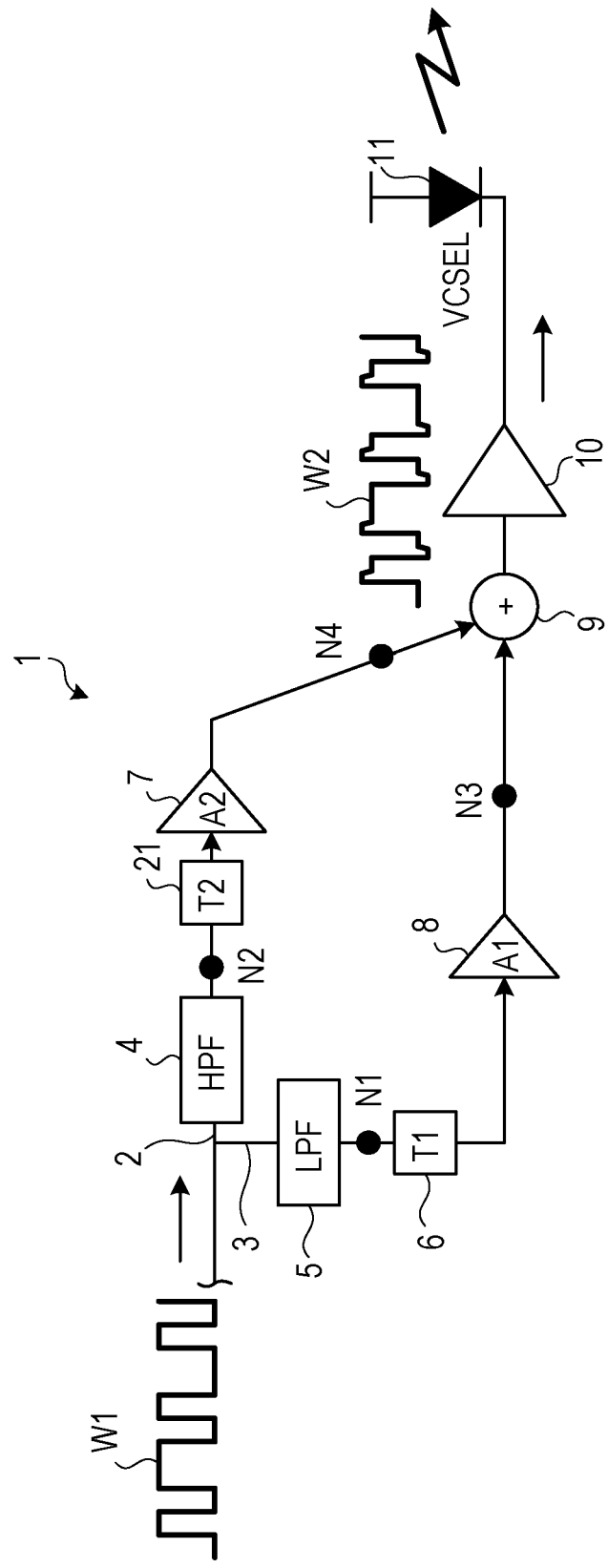
FIG. 14 illustrates a fourth example of the light emitting element drive circuit and the light emitting device according to the embodiment.

FIG. 13 illustrates a third example of the light emitting element drive circuit and the light emitting device according to the embodiment. FIG. 14 illustrates a fourth example of the light emitting element drive circuit and the light emitting device according to the embodiment. As in the third example illustrated in FIG. 13 or the fourth example illustrated in FIG. 14, in the light emitting element drive circuit and the light emitting device illustrated in FIG. 2 or 10, the light emitting element 11 is a cathode driving type, where the anode may be coupled to the power supply line and the cathode may be coupled to the output terminal of the amplifier 10 for example.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A light emitting element drive circuit, comprising:
a plurality of signal paths that respectively propagate a plurality of amplitude-modulated signals obtained by branching an input amplitude-modulated signal;
a plurality of filters different in a frequency band to pass an amplitude-modulated signal;
one or more amplifiers configured to amplify an amplitude-modulated signal;
one or more delay circuits configured to delay an amplitude-modulated signal; and
an addition circuit that adds a plurality of amplitude-modulated signals,
the filter different in the frequency band being arranged in each of the plurality of signal paths,
the delay circuit being arranged in one or more of the plurality of signal paths relatively low in the frequency band,
the amplifier being arranged in one or more of the plurality of signal paths relatively high in the frequency band,
an output end of each of the plurality of signal paths being coupled to the addition circuit, and
the addition circuit adding an amplitude-modulated signal that propagates through one or more of the plurality of signal paths relatively high in the frequency band and is amplified by the amplifier, and an amplitude-modulated signal that propagates through one or more of the plurality of signal paths relatively low in the frequency band and is delayed by the delay circuit.

2. The light emitting element drive circuit according to claim 1, wherein a boundary between the frequency band of the filter relatively low in the frequency band to pass a signal, and the frequency band of the filter relatively high in the frequency band to pass a signal is determined based on a rate equation.

3. The light emitting element drive circuit according to claim 1, wherein the filter arranged in one or more of the plurality of signal paths relatively high in the frequency band delays a signal that passes through the filter.

4. The light emitting element drive circuit according to claim 1, wherein the delay circuit is arranged in one or more of the plurality of signal paths relatively high in the frequency band.

5. A light emitting device, comprising:
a light emitting element that converts an electric signal into an optical signal;
a plurality of signal paths that respectively propagate a plurality of amplitude-modulated signals obtained by branching an input amplitude-modulated signal;
a plurality of filters different in a frequency band to pass an amplitude-modulated signal;
one or more amplifiers configured to amplify an amplitude-modulated signal;
one or more delay circuits configured to delay an amplitude-modulated signal; and
an addition circuit that adds a plurality of amplitude-modulated signals,
the filter different in the frequency band being arranged in each of the plurality of signal paths,
the delay circuit being arranged in one or more of the plurality of signal paths relatively low in the frequency band,
the amplifier being arranged in one or more of the plurality of signal paths relatively high in the frequency band,
an output end of each of the plurality of signal paths being coupled to the addition circuit,
the addition circuit adding an amplitude-modulated signal that is amplified by the amplifier when propagating through one or more of the plurality of signal paths relatively high in the frequency band, and an amplitude-modulated signal that is delayed by the delay circuit when propagating through one or more of the plurality of signal paths relatively low in the frequency band, and
the light emitting element being driven by an output signal of the addition circuit.

6. The light emitting device according to claim 5, wherein a boundary between the frequency band of the filter relatively low in the frequency band to pass a signal, and the frequency band of the filter relatively high in the frequency band to pass a signal is determined based on a rate equation.

7. The light emitting device according to claim 5, wherein the filter arranged in one or more of the plurality of signal paths relatively high in the frequency band delays a signal that passes through the filter.

8. The light emitting device according to claim 5, wherein the delay circuit is arranged in one or more of the plurality of signal paths relatively high in the frequency band.

9. The light emitting device according to one of claims 5, wherein the light emitting element is a surface emitting laser.

* * * * *

UNITED STATES PATENT AND TRADEMARK OFFICE
CERTIFICATE OF CORRECTION

| | | |
|---|---|---|
| PATENT NO. | : 9,124,370 B2 | Page 1 of 1 |
| APPLICATION NO. | : 13/963459 | |
| DATED | : September 1, 2015 | |
| INVENTOR(S) | : Mariko Kase et al. | |

It is certified that error appears in the above-identified patent and that said Letters Patent is hereby corrected as shown below:

In the claims,

Claim 9, Column 10, Line 47

Delete "to one of claims" and insert --to claim--, therefor.

Signed and Sealed this
First Day of December, 2015

Michelle K. Lee
*Director of the United States Patent and Trademark Office*